US012416697B2

(12) United States Patent
Sneag et al.

(10) Patent No.: US 12,416,697 B2
(45) Date of Patent: Sep. 16, 2025

(54) SYSTEM AND APPARATUS FOR SIMPLIFIED DIFFUSION IMAGING FITTING USING A ROTATIONAL INVARIANT DICTIONARY

(71) Applicant: NEW YORK SOCIETY FOR THE RELIEF OF THE RUPTURED AND CRIPPLED, MAINTAINING THE HOSPITAL FOR SPECIAL SURGERY, New York, NY (US)

(72) Inventors: Darryl B. Sneag, Plainview, NY (US); Ek Tsoon Tan, Westbury, NY (US)

(73) Assignee: NEW YORK SOCIETY FOR THE RELIEF OF THE RUPTURED AND CRIPPLED, MAINTAINING THE HOSPITAL FOR SPECIAL SURGERY, New York, NY (US)

( * ) Notice: Subject to any disclaimer, the term of this patent is extended or adjusted under 35 U.S.C. 154(b) by 160 days.

(21) Appl. No.: 18/039,884

(22) PCT Filed: Dec. 14, 2021

(86) PCT No.: PCT/US2021/063358
§ 371 (c)(1),
(2) Date: Jun. 1, 2023

(87) PCT Pub. No.: WO2022/132802
PCT Pub. Date: Jun. 23, 2022

(65) Prior Publication Data
US 2024/0085509 A1     Mar. 14, 2024

Related U.S. Application Data

(60) Provisional application No. 63/125,887, filed on Dec. 15, 2020.

(51) Int. Cl.
G01V 3/00       (2006.01)
G01R 33/56      (2006.01)
G01R 33/563     (2006.01)

(52) U.S. Cl.
CPC ... *G01R 33/56341* (2013.01); *G01R 33/5602* (2013.01); *G01R 33/5608* (2013.01)

(58) Field of Classification Search
CPC .......... G01R 33/56341; G01R 33/5602; G01R 33/5608
(Continued)

(56) References Cited

U.S. PATENT DOCUMENTS

2010/0292560 A1 * 11/2010 Wyrwicz ................. A61B 5/055
                                                              600/410
2015/0253410 A1    9/2015 Warfield et al.
(Continued)

FOREIGN PATENT DOCUMENTS

CN    102272795 A  * 12/2011  ........... A61B 5/4848
CN    104545916 A  *  4/2015  ........... A61B 5/0033
(Continued)

OTHER PUBLICATIONS

International Preliminary Report on Patentability in International Appln. No. PCT/US2021/063358, dated Jun. 29, 2023, 8 pages.
(Continued)

*Primary Examiner* — Walter L Lindsay, Jr.
*Assistant Examiner* — Frederick Wenderoth
(74) *Attorney, Agent, or Firm* — Fish & Richardson P.C.

(57) ABSTRACT

A computer-implemented method includes: generating a set of simulated diffusion signals based on a corresponding set of diffusion sampling parameters and a corresponding set of micro structural model parameters, wherein the diffusion sample parameters correspond to magnetic resonance (MR) parameters, and wherein the microstructural model param-
(Continued)

eters characterizing a microscopic diffusion with a spatial orientation; processing the set of simulated diffusion signals based on the corresponding set of diffusion sampling parameters to generate a first set of output metrics, wherein the first set of output metrics are associated with the spatial orientation; consolidating multiple sets of output metrics into a dictionary, wherein each set of the multiple sets of output metrics are generated by processing a corresponding set of simulated diffusion signals and associated with a corresponding spatial orientation; applying the dictionary to a set of acquired diffusion MR signals; and generating at least one macroscopic diffusion feature that is orientation invariant.

20 Claims, 7 Drawing Sheets

(58) Field of Classification Search
USPC .......................................................... 324/309
See application file for complete search history.

(56) References Cited

U.S. PATENT DOCUMENTS

| | | |
|---|---|---|
| 2016/0343129 A1 | 11/2016 | Novikov et al. |
| 2017/0007148 A1 | 1/2017 | Kaditz et al. |
| 2017/0113046 A1 | 4/2017 | Fried et al. |
| 2019/0353732 A1* | 11/2019 | McGivney ......... G01R 33/5608 |

FOREIGN PATENT DOCUMENTS

| | | | | | |
|---|---|---|---|---|---|
| CN | 108471982 A | * | 8/2018 | ............. | A61B 5/055 |
| CN | 109923426 A | * | 6/2019 | ............. | A61B 5/055 |
| JP | 2002042130 A | * | 2/2002 | | |
| WO | WO-2018106713 A1 | * | 6/2018 | ........... | A61B 5/0042 |
| WO | WO-2018187764 A1 | * | 10/2018 | ............. | A61B 5/004 |

OTHER PUBLICATIONS

International Search Report and Written Opinion in International Appln. No. PCT/US2021/063358, dated Mar. 21, 2022, 9 pages.

Reisert et al., "The Diffusion Dictionary in the Human Brain Is Short: Rotation Invariant Learning of Basis Functions," Computational Diffusion MRI and Brain Connectivity: MICCAI Workshops, Nov. 2013, pp. 47-55.

Rensonnet et al., "Towards microstructure fingerprinting: Estimation of tissue properties from a dictionary of Monte Carlo diffusion MRI simulations," Neuroimage, Jan. 2019, 184:964-980.

Extended European Search Report in European Appln. No. 21907649.4, mailed on Oct. 11, 2024, 12 pages.

* cited by examiner

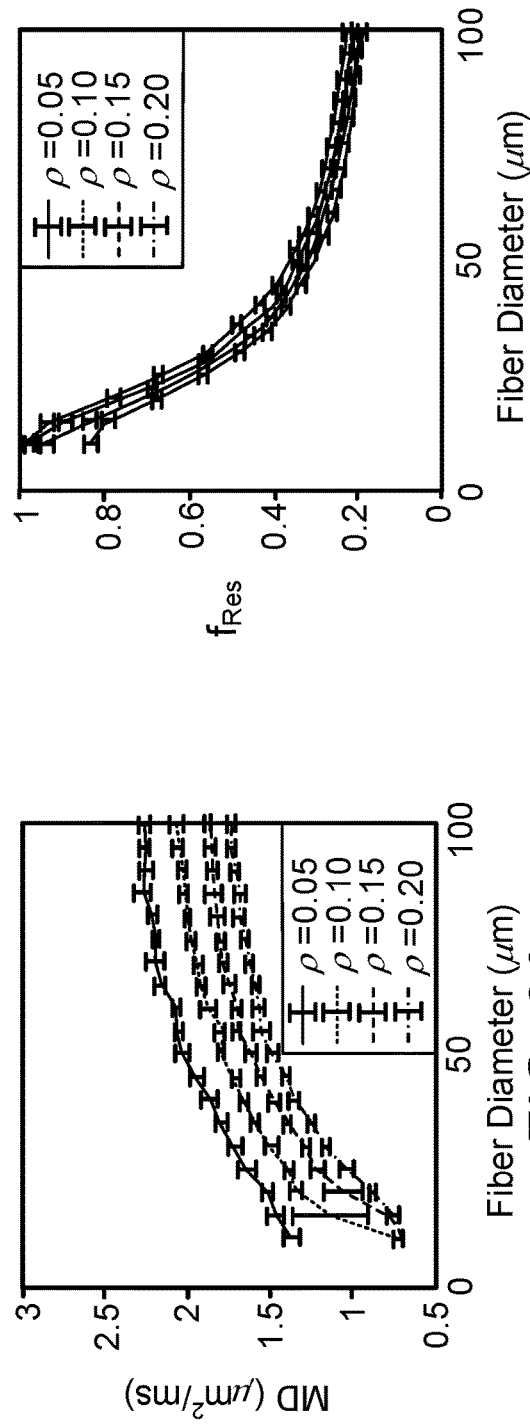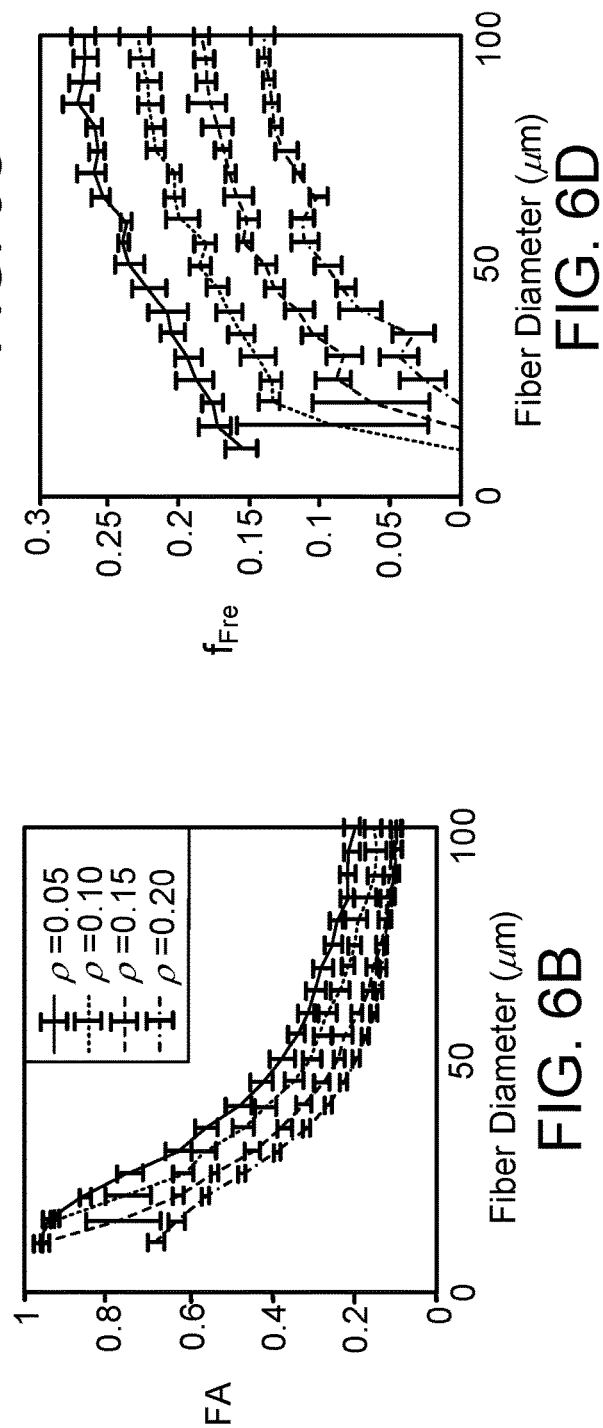
FIG. 6A  FIG. 6B  FIG. 6C  FIG. 6D

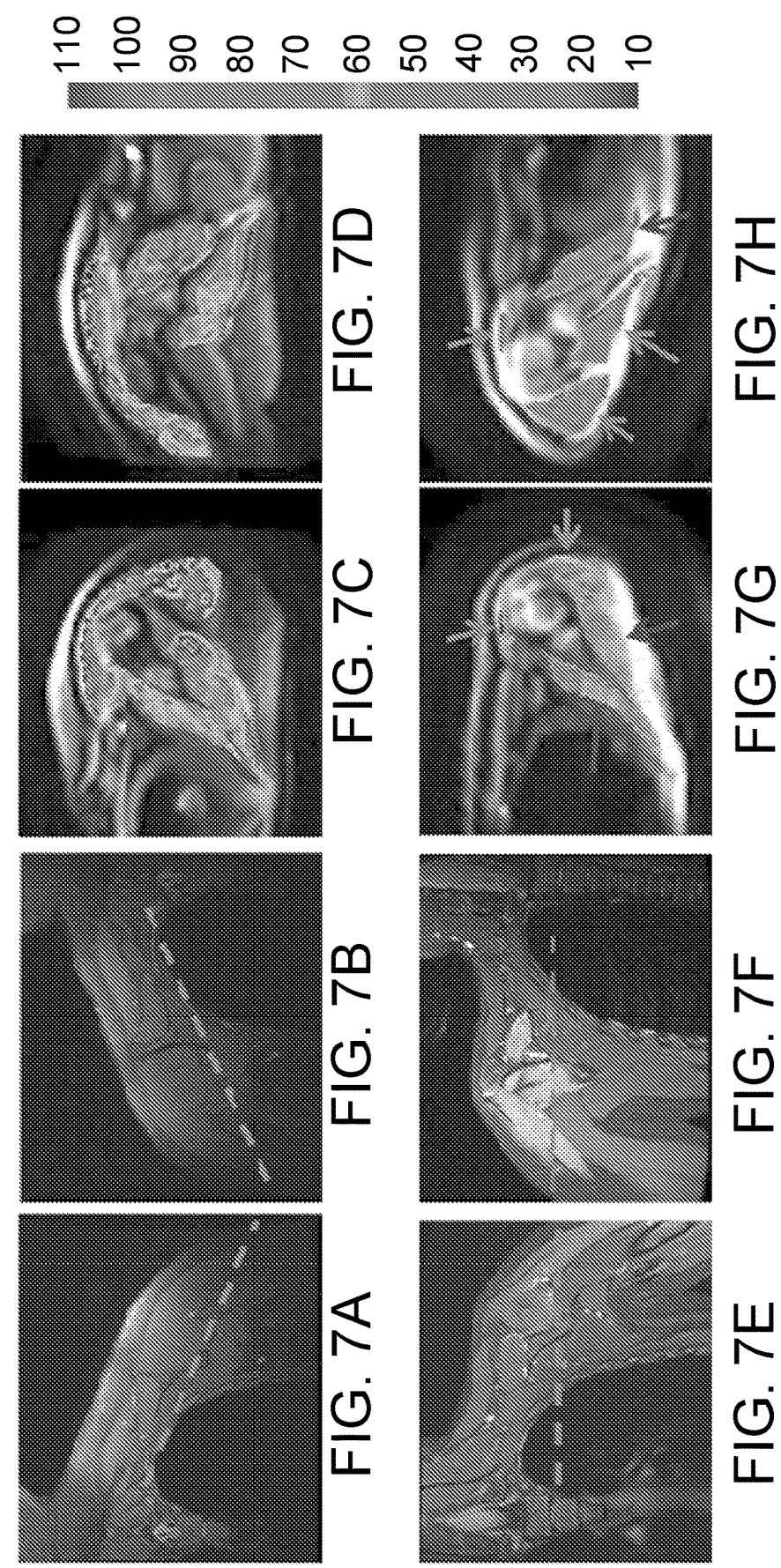

SYSTEM AND APPARATUS FOR SIMPLIFIED DIFFUSION IMAGING FITTING USING A ROTATIONAL INVARIANT DICTIONARY

RELATED APPLICATION

This application claims benefit of U.S. Provisional Application No. 63/125,887, filed on Dec. 15, 2020, the entire contents of which are incorporated by reference.

TECHNICAL FIELD

This description generally relates to magnetic resonance imaging (MRI).

BACKGROUND

MRI is a noninvasive medical diagnostic technique in which the absorption and transmission of high-frequency radio waves are analyzed as they irradiate the hydrogen atoms in water molecules and other tissue components placed in a strong magnetic field. MRI provides soft-tissue images with superior contrast compared to other imaging modalities and has therefore become widely used for human imaging. Diffusion imaging is an MRI method that produces in vivo magnetic resonance images of biological tissues sensitized with the local characteristics of molecular diffusion, generally water. Diffusion imaging thus allows the mapping of the diffusion process of molecules, mainly water, in biological tissues, in vivo and non-invasively. Molecular diffusion in tissues is not free, but reflects interactions with many obstacles, such as macromolecules, fibers, and membranes. Water molecule diffusion patterns can therefore reveal microscopic details about tissue architecture, either normal or in a diseased state.

SUMMARY

In one aspect, implementations provide a computer-implemented method that includes: generating a set of simulated diffusion signals based on a corresponding set of diffusion sampling parameters and a corresponding set of microstructural model parameters, wherein the diffusion sample parameters correspond to magnetic resonance (MR) parameters for acquiring MR signals, and wherein the microstructural model parameters characterize a microscopic diffusion with a spatial orientation; processing the set of simulated diffusion signals based on the corresponding set of diffusion sampling parameters to generate a set of output metrics, wherein the set of output metrics are associated with the spatial orientation; consolidating multiple sets of output metrics into a dictionary, wherein each set of the multiple sets of output metrics are generated by processing a corresponding set of simulated diffusion signals and are associated with a corresponding spatial orientation; applying the dictionary to a set of acquired diffusion MR signals; and subsequently generating at least one macroscopic diffusion feature that is orientation invariant.

Implementations may include one or more of the following features.

The applying may include: processing the set of acquired diffusion MR signals to generate a set of acquired metrics; and based on the set of acquired metrics, performing a lookup at the dictionary to generate the at least one macroscopic diffusion feature. The set of acquired diffusion MR signals may be associated with a corresponding set of diffusion sample parameters.

The at least one macroscopic diffusion feature may include: an apparent fiber diameter, and an apparent fluid fraction. The output metrics may include: a mean diffusivity MD, an axial diffusivity AD, a radial diffusivity RD, a fractional anisotropy FA, and a compartment fraction $f_{Res}$ for restricted motion, a compartment fraction $f_{Hin}$ for hindered motion, and a compartment fraction $f_{Fre}$ for free motion. The diffusion sampling parameters may include: a b-value b, a normalized gradient vector g, a mixing time $\Delta$, and a pulse width $\delta$. The microstructural model parameters may include: a radius r, an intracellular diffusivity $D_0$, a fluid fraction $\rho$, a parallel diffusivity $D_1$, and a fluid diffusivity $D_\rho$.

The processing may include: performing one or more diffusion fittings of the set of simulated diffusion signals. The one or more diffusion fittings may include: a model-based de-noising, or a diffusion tensor imaging (DTI) fitting.

The consolidating may include: averaging the multiple sets of output metrics, and wherein said averaging comprises one of: an arithmetic mean, a geometric mean, or a median.

In another aspect, implementations may provide a computer system that includes at least one computer processor configured to perform operations of: generating a set of simulated diffusion signals based on a corresponding set of diffusion sampling parameters and a corresponding set of microstructural model parameters, wherein the diffusion sample parameters correspond to magnetic resonance (MR) parameters for acquiring MR signals, and wherein the microstructural model parameters characterizing a microscopic diffusion with a spatial orientation; processing the set of simulated diffusion signals based on the corresponding set of diffusion sampling parameters to generate a set of output metrics, wherein the set of output metrics are associated with the spatial orientation; consolidating multiple sets of output metrics into a dictionary, wherein each set of the multiple sets of output metrics are generated by processing a corresponding set of simulated diffusion signals and are associated with a corresponding spatial orientation; applying the dictionary to a set of acquired diffusion MR signals; and subsequently generating at least one macroscopic diffusion feature that is orientation invariant.

Implementations may include one or more of the following features.

The operation of applying a set of acquired diffusion MR signals to the dictionary may include: processing the set of acquired diffusion MR signals to generate a set of acquired metrics; and based on the set of acquired metrics, performing a lookup at the dictionary to generate the at least one macroscopic diffusion feature. The set of acquired diffusion MR signals may be associated with a corresponding set of diffusion sample parameters.

The at least one macroscopic diffusion feature may include: an apparent fiber diameter, and an apparent fluid fraction. The output metrics may include: a mean diffusivity MD, an axial diffusivity AD, a radial diffusivity RD, a fractional anisotropy FA, and a compartment fraction $f_{Res}$ for restricted motion, a compartment fraction $f_{Hin}$ for hindered motion, and a compartment fraction $f_{Fre}$ for free motion. The diffusion sampling parameters may include: a b-value b, a normalized gradient vector g, a mixing time $\Delta$, and a pulse width $\delta$. The microstructural model parameters may include: a radius r, an intracellular diffusivity $D_0$, a fluid fraction $\rho$, a parallel diffusivity $D_1$, and a fluid diffusivity $D_\rho$.

The operation of processing the set of simulated diffusion signals may include: performing one or more diffusion fittings of the set of simulated diffusion signals. The one or more diffusion fittings may include: a model-based denoising, or a diffusion tensor imaging (DTI) fitting. The operation of consolidating multiple sets of output metrics may include: averaging the multiple sets of output metrics, and wherein said averaging comprises one of: an arithmetic mean, a geometric mean, or a median.

Implementations according to the present disclosure may be realized in computer implemented methods, hardware computing systems, and tangible computer readable media. For example, a system of one or more computers can be configured to perform particular actions by virtue of having software, firmware, hardware, or a combination of them installed on the system that in operation causes or cause the system to perform the actions. One or more computer programs can be configured to perform particular actions by virtue of including instructions that, when executed by data processing apparatus, cause the apparatus to perform the actions.

The details of one or more implementations of the subject matter of this specification are set forth in the description, the claims, and the accompanying drawings. Other features, aspects, and advantages of the subject matter will become apparent from the description, the claims, and the accompanying drawings.

BRIEF DESCRIPTION OF THE DRAWINGS

Embodiments will now be described, by way of example only, with reference to the drawings, in which:

FIGS. 6A to 6D show results from the muscle fiber diameter example of FIG. 5 according to some implementations.

FIG. 7 shows examples from analyzing muscle fiber diameter for two subjects according to some implementations.

Like reference symbols in the various drawings indicate like elements.

DETAILED DESCRIPTION

Figure 1:
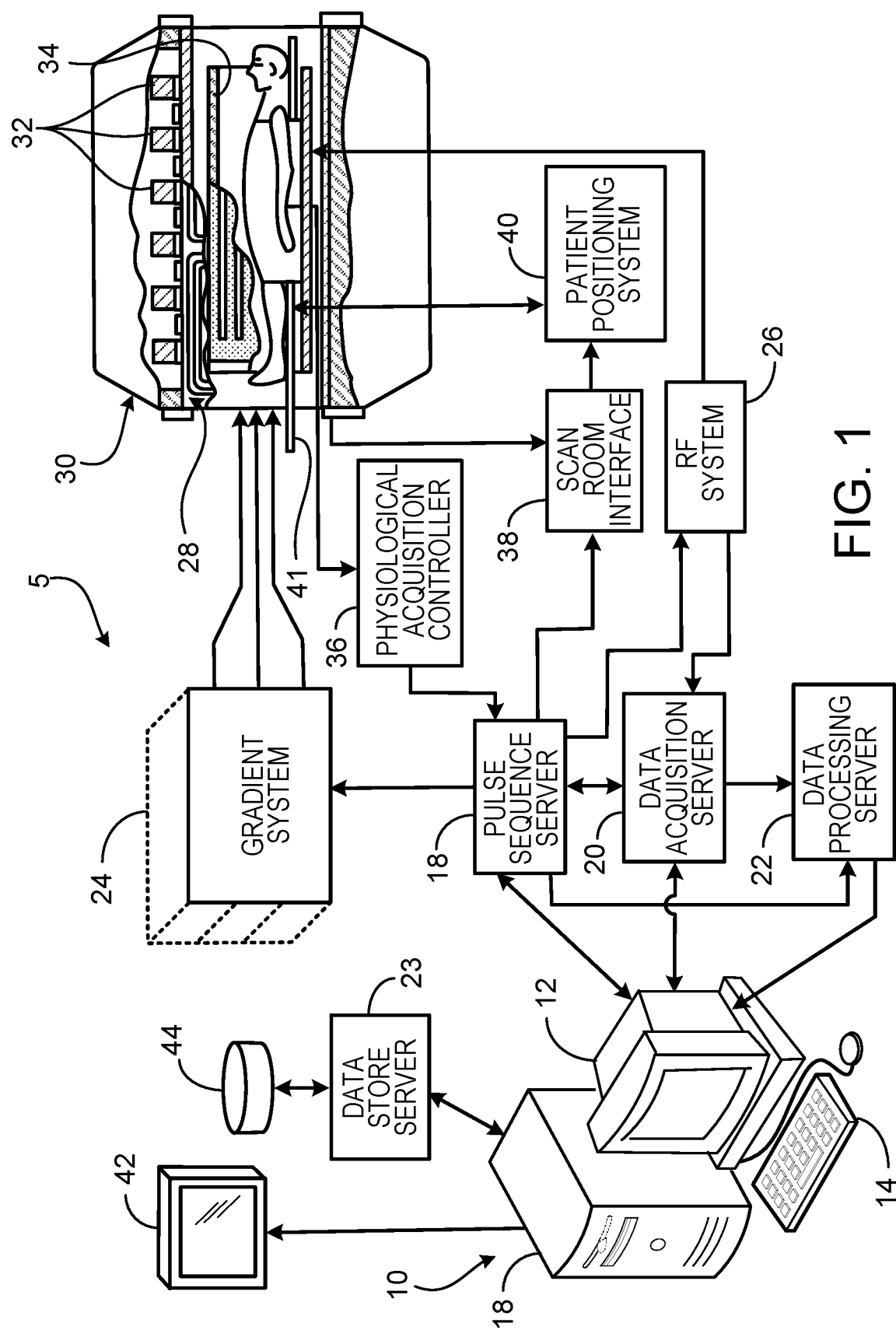
FIG. 1 shows an example of a magnetic resonance imaging (MRI) system.

MRI can be made sensitive to the motion of molecules. Regular MRI acquisition utilizes the behavior of protons in water to generate contrast between clinically relevant features of a particular subject. The versatile nature of MRI renders it capable of producing contrast related to the structure of tissues at the microscopic level. In an MRI image, water molecules in a sample are excited with the imposition of a strong magnetic field. This causes many of the protons in water molecules to precess simultaneously, producing signals in MRI. In weighted images, contrast is produced by measuring the loss of coherence or synchrony between the water protons. When water is in an environment where it can freely tumble, relaxation tends to take longer. In certain clinical situations, this altered relaxation can generate contrast between an area of pathology and the surrounding healthy tissue.

To sensitize MRI images to diffusion, the magnetic field strength ($B_1$) is varied linearly by a pulsed field gradient. Since precession is proportional to the magnet strength, the protons begin to precess at different rates, resulting in dispersion of the phase and signal loss. Another gradient pulse is applied in the same magnitude but with opposite direction to refocus or rephase the spins. The refocusing will not be perfect for protons that have moved during the time interval between the pulses, and the signal measured by the MRI machine is reduced.

In order to localize this signal attenuation to obtain diffusion images, one has to combine the pulsed magnetic field gradient pulses used for MRI (aimed at localization of the signal, but those gradient pulses are too weak to produce a diffusion related attenuation) with additional "motion-probing" gradient pulses. Summarizing all the gradient terms in a "b factor" (which depends only on the acquisition parameters), the signal attenuation of the non-diffusion signal $S_0$ can be characterized as:

$$S = S_0 \exp(-bD), \text{ or}$$

Here, b is gradient strength, and D, or ADC is the apparent diffusion coefficient indicating that the diffusion process is not free in tissues, but hindered and modulated by many mechanisms (restriction in closed spaces, tortuosity around obstacles, etc.)

In the context of applying diffusion imaging to quantify muscle fibers, a major challenge is to reliably and non-invasively estimate the muscle fiber diameter using a cylinder model. A solution to this challenge can render it feasible to depict microstructural changes of the muscle following pathologic insult, which can aid in the diagnosis and treatment of neuromuscular conditions.

For parameter fitting of diffusion imaging data, complex models may involve many parameters related to the radial and angular dimensions of diffusivity. Previously reported approaches generally focus on fitting either the radial or angular dimensions, alone, to simplify the fitting process. Under conventional wisdom, fitting for both radial and angular diffusivity is feasible, but it is computationally intensive and can result in poor convergence of the fitted solution.

Notably, the diameter is in the radial direction, for which a rotationally-invariant method would be better suited. The first technical challenge is to identify a robust, rotationally-invariant way to fit the model, for example, a cylindrical model. To this end, simple, rotationally-invariant metrics, as proposed in the literature, are not directly related to the more complicated fiber diameter model. Other approaches that leverage rotationally-invariant basis functions generally include parameters that operate by virtue of complicated mathematical analytics for relating cylinders to these basis functions. Such may not lend itself to a practical solution in most cases.

The second technical challenge is to find an efficient way to fit the cylinder model to the estimation muscle fiber diameter. While various optimization methods can be used, these methods tend to be computationally time consuming. Moreover, these methods have focused on angular diffusivity, and are not rotationally-invariant. A dictionary method can be efficiently applied for look-up. Furthermore, if the size of the dictionary can be reduced, computational time can be decreased.

FIG. 1 shows an example of a magnetic resonance imaging (MRI) system 5 with a solenoid magnet for imaging knee joints. The MRI system 5 includes a workstation 10 having a display 12 and a keyboard 14. The Workstation 10 includes a processor 16 that is a commercially available programmable machine running a commercially available operating system. The workstation 10 provides the operator interface that enables scan prescriptions to be entered into the MRI system 5. The workstation 10 is coupled to four servers including a pulse sequence server 18, a data acquisition server 20, a data processing server 22, and a data store server 23. The work station 10 and each server 18, 20, 22 and 23 are connected to communicate with each other.

The pulse sequence server 18 functions in response to instructions downloaded from the workstation 10 to operate a gradient system 24 and an RF system 26. Gradient waveforms necessary to perform the prescribed scan are produced and applied to the gradient system 24 that excites gradient coils in an assembly 28 to produce the magnetic field gradients Gx, Gy and Gz used for position-encoding MR signals. The gradient coil assembly 28 forms part of a magnet assembly 30 that includes a polarizing magnet 32 and a whole-body RF coil 34.

RF excitation waveforms are applied to the RF coil 34 by the RF system 26 to perform the prescribed magnetic resonance pulse sequence. Responsive MR signals detected by the RF coil 34 or a separate local coil (not shown in FIG. 1) are received by the RF system 26, amplified, demodulated, filtered, and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays (not highlighted in FIG. 1).

The RF system 26 also includes one or more RF receiver channels. Each RF receiver channel includes an RF amplifier that amplifies the MR signal received by the coil to which it is connected and a detector that detects and digitizes the I and Q quadrature components of the received MR signal.

The pulse sequence server 18 also optionally receives patient or subject data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heartbeat.

The pulse sequence server 18 also connects to a scan room interface circuit 38 that receives signals from various sensors associated with the condition of the patient and the magnet system. It is also through the scan room interface circuit 38 that a patient positioning system 40 receives commands to move the patient to desired positions during the scan by translating the patient table 41.

The digitized MR signal samples produced by the RF system 26 are received by the data acquisition server 20. The data acquisition server 20 operates in response to instructions downloaded from the workstation 10 to receive the real-time MR data and provide buffer storage such that no data is lost by data overrun. In some scans the data acquisition server 20 does little more than pass the acquired MR data to the data processor server 22. However, in scans that require information derived from acquired MR data to control the further performance of the scan, the data acquisition server 20 is programmed to produce such information and convey it to the pulse sequence server 18. For example, during prescans, MR data is acquired and used to calibrate the pulse sequence performed by the pulse sequence server 18. Also, navigator signals may be acquired during a scan and used to adjust RF or gradient system operating parameters or to control the view order in which k-space is sampled. In all these examples the data acquisition server 20 acquires MR data and processes it in real-time to produce information that is used to control the scan.

The data processing server 22 receives MR data from the data acquisition server and processes it in accordance with instructions downloaded from the workstation 10. Such processing may include, for example, Fourier transformation of raw k-space MR data to produce two or three dimensional images, the application of filters to a reconstructed image, the performance of a back projection image reconstruction of acquired MR data; the calculation of functional MR images, the calculation of motion or flow images, and the like.

Images reconstructed by the data processing server 22 are conveyed back to the workstation 10 where they are stored. Real-time images are stored in a data base memory cache (not shown) from which they may be output to operator display 12 or a display 42 that is located near the magnet assembly 30 for use by physicians. Batch mode images or selected real time images are stored in a host database on disc storage 44. When such images have been reconstructed and transferred to storage, the data processing server 22 notifies the data store server 23 on the workstation 10. The Workstation 10 may be used by an operator to archive the images, produce films, or send the images via a network to other facilities.

As shown in FIG. 1, the RF system 26 may be connected to the whole body RF coil 34 while a transmitter section of the RF system 26 may connect to one RF coil 152A and its receiver section may connect to a separate RF receive coil 152B. Often, the transmitter section is connected to the whole body RF coil 34 and each receiver section is connected to a separate local coil 152B. In this illustration, RF receive coil 152B can be a phased array coil. In some cases, the phased array coil is a receive-only coil. In other cases, the phased array coil functions as both a transmitter and a receiver (also known as a transceiver).

For additional context, an MRI scanner can be adapted to perform diffusion imaging. For example, in combination with innovative gradient waveforms and timing, a variety of diffusion MR techniques enable the measurement of the restricted diffusion of water in tissue to capture the spatial distribution of diffusion, which can be anisotropic. These MR techniques include, for example, diffusion weighted imaging and diffusion tensor imaging (DTI). For context, DTI can produce not only neural tract images but also images of the muscle—including heart muscle—as well as other tissues such as the prostate.

In DTI, each voxel has one or more pairs of parameters: a rate of diffusion and a preferred direction of diffusion—described in terms of three-dimensional space—for which that parameter is valid. The properties of each voxel of a single DTI image can be calculated by vector or tensor math from six or more different diffusion weighted acquisitions, each obtained with a different orientation of the diffusion sensitizing gradients. In some methods, hundreds of measurements—each making up a complete image—are made to generate a single resulting calculated image data set. The higher information content of a DTI voxel makes it extremely sensitive to subtle pathology in the brain. In addition, the directional information can be exploited at a higher level of structure to select and follow neural tracts through the brain—a process called tractography.

In more detail, during image acquisition, the image-intensities at each position are attenuated, depending on the strength (b-value) and direction of the so-called magnetic diffusion gradient, as well as on the local microstructure in which the water molecules diffuse. The more attenuated the image is at a given position, the greater diffusion there is in the direction of the diffusion gradient. In order to measure the tissue's complete diffusion profile, one needs to repeat the MR scans, applying different directions (and possibly strengths) of the diffusion gradient for each scan.

Various brain and muscle pathologies may be detected by measuring anisotropy and diffusivity. As mentioned, the underlying physical process of diffusion causes a group of water molecules to move out from a central point, and gradually reach the surface of an ellipsoid or cylinder if the medium is anisotropic, or the surface of a sphere in the case of an isotropic medium. The ellipsoid formalism functions also as a mathematical method of organizing tensor data. Measurement of an ellipsoid tensor further permits a retrospective analysis, to gather information about the process of diffusion in each voxel of the tissue. Once each voxel has been measured from six or more directions, the spatial distribution of the diffusion for each voxel can be characterized based on information from the ellipsoid tensor. The diffusion is thus quantified as a tensor to characterize, for example, anisotropic properties in space.

Figure 2:
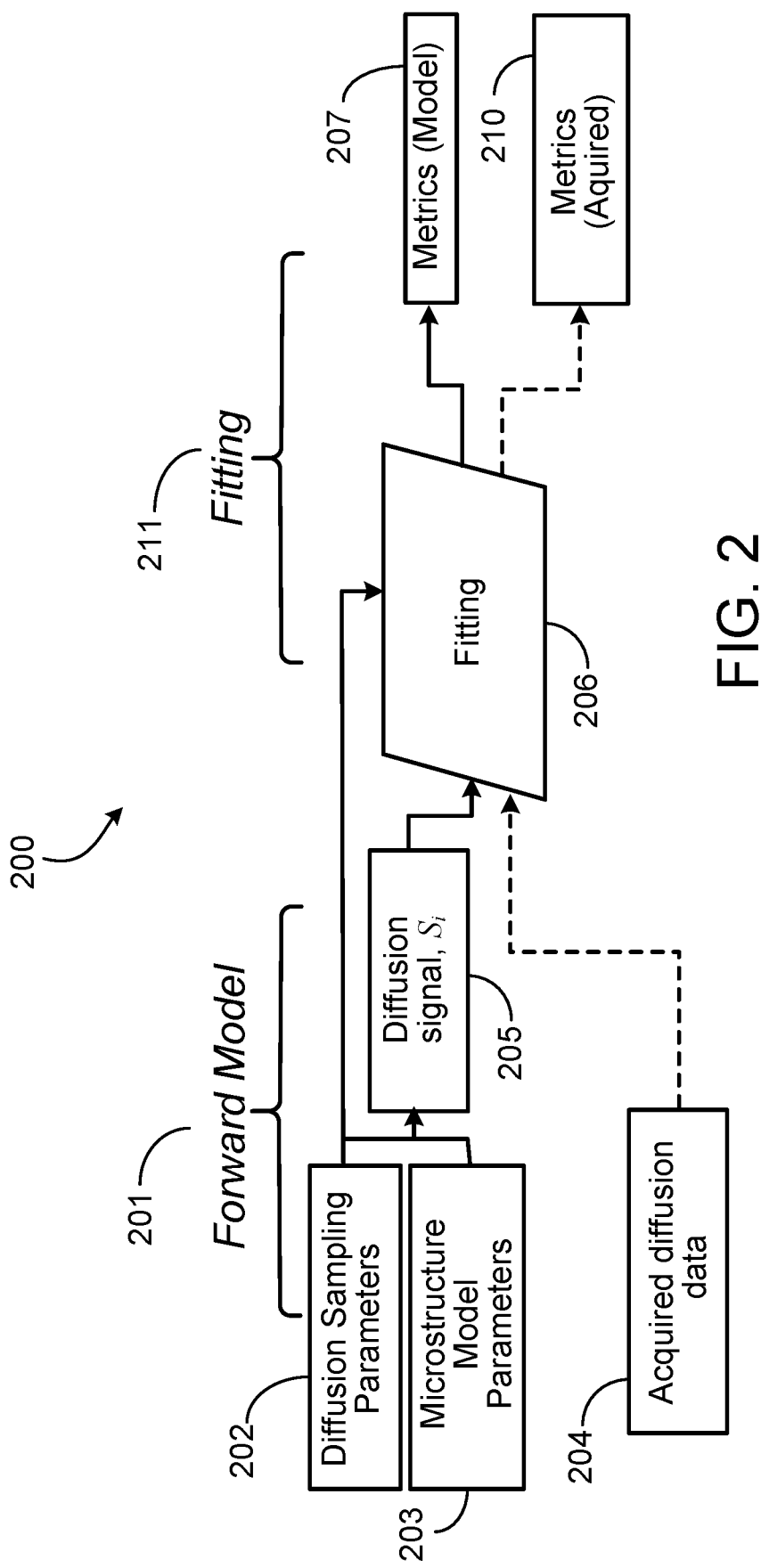
FIG. 2 is a diagram illustrating an example of generating an orientationally-invariant dictionary according to some implementations.

Various implementations of the present disclosure can perform orientation-invariant diffusion fitting by constructing an orientationally-invariant dictionary for the fitting. As shown in FIG. 2, diagram 200 illustrates an example of generating an orientationally-invariant dictionary according to some implementations. This diagram 200 includes forward model 201 and fitting segment 211. During forward model 201, diffusion sampling parameters 202 and desired microstructure model parameters 203 are combined and correlated to generate the diffusion signal 205. Examples of diffusion sampling parameters include: a b-value, a gradient amplitude, a pulse width (e.g., associated with the gradient waveform), a mixing time (e.g., characterizing the temporal separation between two gradient waveforms surrounding, for example, a 180 degree inversion radio-frequency pulse), a gradient direction (e.g., in a three dimensional space), and a q-value (e.g., a value in q space for characterizing the motion of slow-diffusion component). As to the microstructural model parameters, examples can include: fiber diameter, spherical diameter, cell size, and axon diameter. The forward model 201 can combine diffusion sampling parameters 202 and desired microstructural model parameters 203 to generate diffusion signal 205, which can be simulated. Such diffusion signal 205, as well as diffusion sampling parameters, are then processed by the fitting block 206 to generate diffusion metrics 207. These metrics can include mean diffusivity, radial diffusivity, axial diffusivity, fractional anisotropy, and fraction of compartments of diffusivity such as the restricted fraction, hindered fraction and free fraction. In addition, the acquired diffusion data 204, which is fed separately into the fitting block 206 to generate the metrics (acquired) 208 that are computed for the forward model diffusion signal 205.

Figure 3:
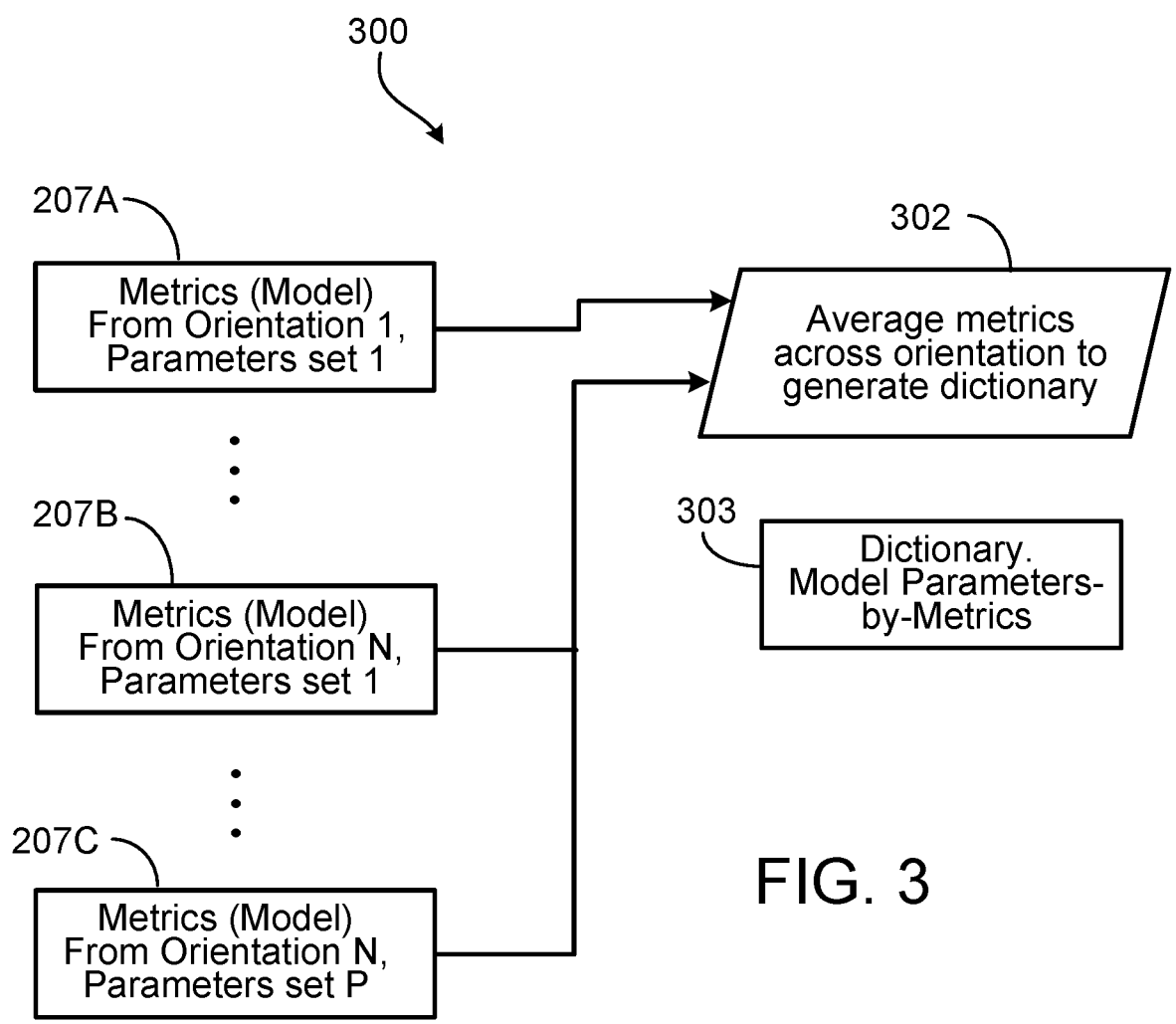
FIG. 3 is a diagram illustrating an example of feeding metrics for each model parameter set and orientation according to some implementations.

FIG. 3 is a diagram 300 illustrating an example of feeding metrics for each model parameter set and orientation according to some implementations. In more detail, diagram 300 shows the next step that constructs a dictionary. As illustrated, diagram 300 involves feeding the metrics (model) for each model parameter set (1 to P) and orientation (1 to N). These instances of metrics (model) are illustrated by metrics (model) 207A (from orientation 1, parameter set 1), metrics (model) 207B (from orientation N, parameter set 1), and metrics (model) 207C (from orientation N, parameter set P). These instances of metrics are averaged across all orientations 302 to generate an averaged metric-by-parameter dictionary 303. This averaging is typically best depicted by an arithmetic mean, although geometric mean and median may also apply.

Figure 4:
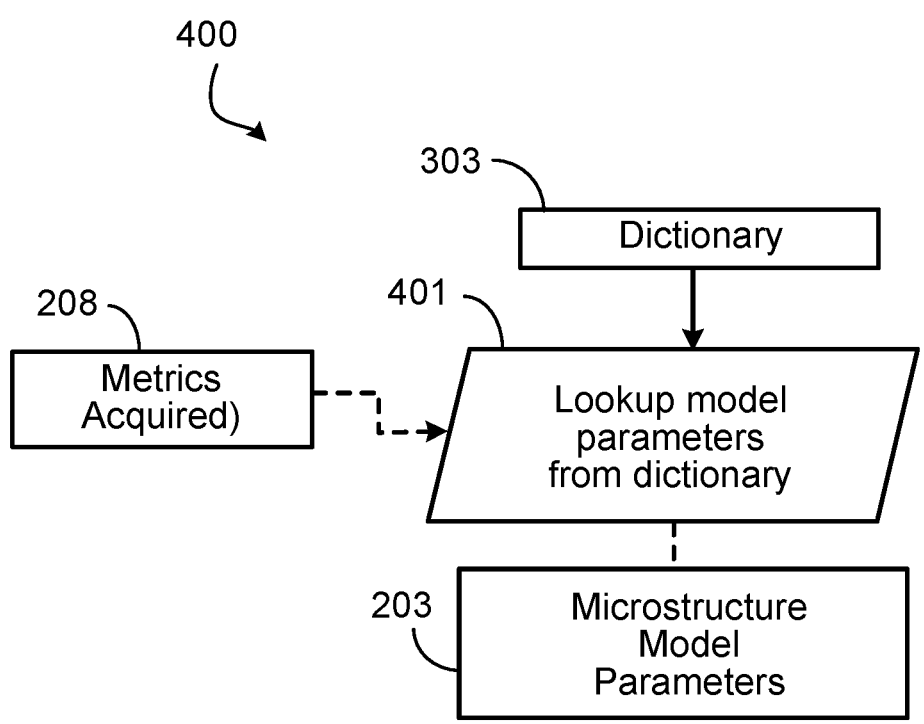
FIG. 4 is a diagram illustrating an example of using the metrics (acquired) and the dictionary to look up microstructural model parameters according to some implementations.

FIG. 4 is a diagram 400 illustrating an example of using the metrics (acquired) and the dictionary to look up microstructure model parameters according to some implementations. Here, the metrics (acquired) 208 are provided to look-up block 401, along with the earlier generated dictionary 303 as inputs. The dictionary 303 is used to look-up the output model parameters based on the incoming instance of metrics (acquired) 208. In turn, the look-up block 401 identifies microstructure model parameters 203. As illustrated, the application of the dictionary allows the microstructure model parameters 203 to be generated in one look-up operation, rather than a lengthy fitting and optimization process, which can be timing consuming and prone to inaccuracies due to, for example, local minima during a typical simplex search or gradient descent search.

Figure 5:
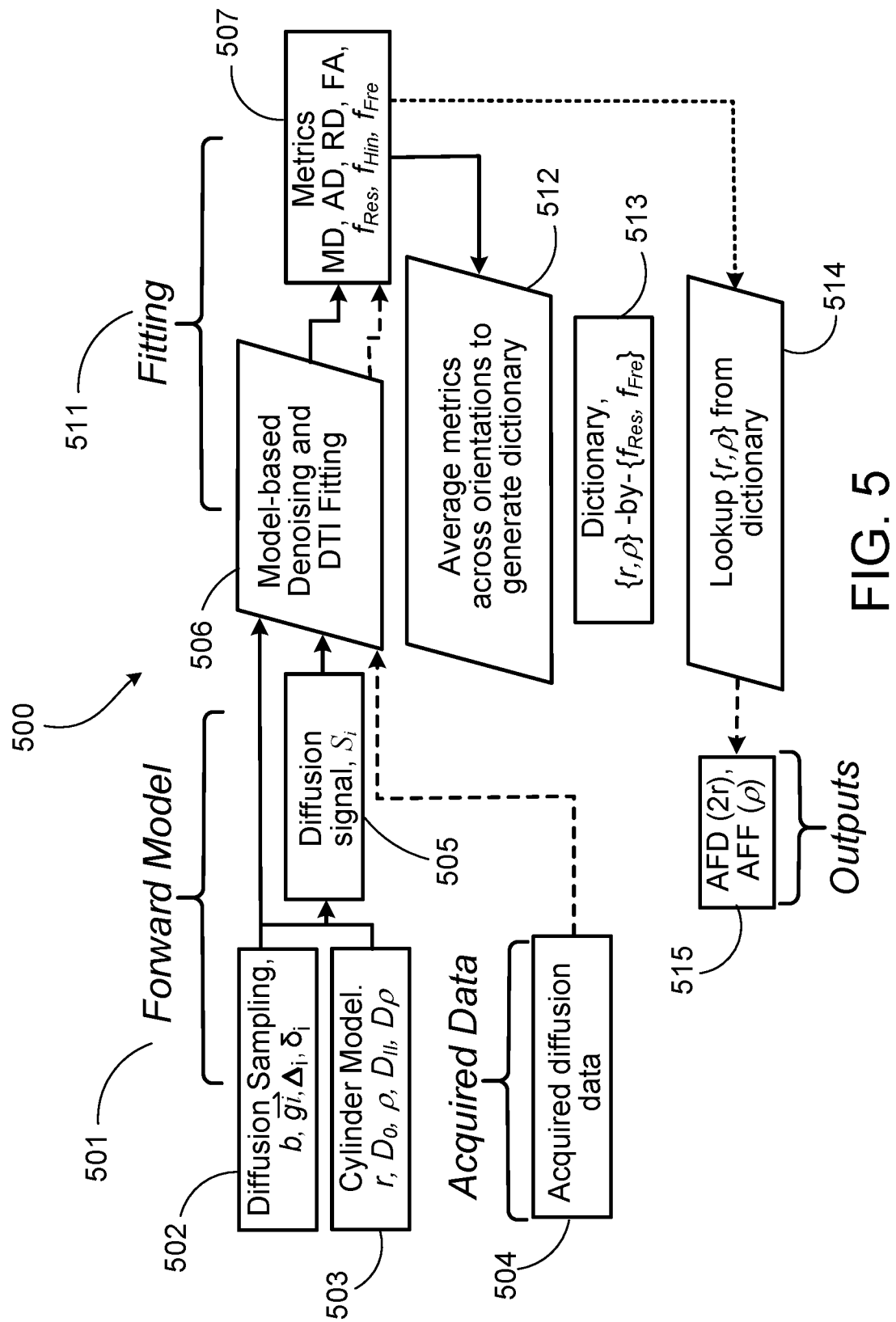
FIG. 5 is a diagram illustrating an example of applying the orientation-invariant diffusion fitting for a muscle fiber diameter application according to some implementations.

FIG. 5 is a diagram 500 illustrating an example of applying the orientation-invariant diffusion fitting for a muscle fiber diameter application according to some implementations. Diagram 500 includes a forward model 501 and a fitting segment 502 that demonstrate an example of applying the orientation-invariant diffusion fitting to investigating a muscle fiber diameter, based on a combination of steps from FIGS. 2-4. Here, the solid line arrows indicate the model processing and dashed lines indicate acquired data processing. As illustrated, diffusion sample parameters 502 (including, for example, b-value, b, normalized gradient vector g, mixing time Δ, and pulse width δ) and cylinder model parameters 503 (including radius r, intracellular diffusivity $D_0$, fluid fraction ρ, parallel diffusivity $D_1$ and fluid diffusivity $D_ρ$) are combined to generate diffusion signal 505. Diffusion sample parameters 502 and diffusion signal 505 are provided to fitting block 506 for DTI fitting and model-based de-noising. Fitting block 506 generates output metrics 507 that are rotationally-invariant. Examples of such output metrics include mean diffusivity MD, axial diffusivity AD, radial diffusivity RD, fractional anisotropy FA, and compartment fractions for restricted $f_{Res}$, hindered $f_{Hin}$ and free $f_{Fre}$. In general, mean diffusivity characterizes diffusion as a scalar quantity. In comparison, axial diffusivity, and radial diffusivity characterize diffusion along a respective direction. Fractional anisotropy refers to a fraction of the diffusion that is anisotropic. By way of background, most fluids and some homogeneous solid materials like gels, diffusion is the same in every direction. These substances are called isotropic and are characterized by a single diffusion coefficient (D). Biological tissues, on the other hand, are highly structured and typically have different diffusion coefficients along different directions and are called anisotropic. Virtually all biological materials demonstrate some degree of anisotropy. White matter is highly anisotropic because of the parallel orientation of its nerve fiber tracts. Other tissues demonstrating significant anisotropy include skeletal muscle and peripheral nerves. Free water diffusion describes the random (Brownian) motion of water molecules due to thermal agitation, in the absence of any obstacles. Hindered and restricted diffusion are two distinct processes that result from fundamentally different behavior of spins within different tissue compartments, which may be either intra- or extracellular depending on the type of tissue being modeled. In the context of muscle fiber diffusion anisotropy, the number of orientations used can be 30 for muscle fibers, although this could be increased to >100 for highly anisotropic axons in the brain or just 6 for more isotropic tissue. A collection of the metrics (model) can be averaged across various orientations 512 to generate dictionary 513. The diffusion data acquired with the same diffusion sampling parameters 504 are fed into the same fitting block 506 to obtain the acquired metrics 507. The acquired metrics are then provided along with the dictionary 513 for a processor to look up the dictionary 514 to identify output parameters 515. Looking up the table usually involves finding the values in the dictionary that best approximate the acquired metrics, such as the nearest neighbor value in the dictionary. In some cases, examples of the output parameters include apparent fiber diameter AFD=2r and apparent fluid fraction AFF=ρ.

FIGS. 6A to 6D show results from the muscle fiber diameter example of FIG. 5 according to some implementations. In particular, FIGS. 6A to 6D respectively shows the metrics of mean diffusivity (MD), fractional anisotropy (FA), compartment fractions for restricted $f_{Res}$ and compartment fractions for free $f_{Fre}$ as a function of fiber diameter r for a range of apparent fluid fraction ρ.

FIG. 7 shows examples from analyzing muscle fiber diameter for two subjects according to some implementations. In particular, FIG. 7 shows results from two clinical examples: a healthy subject in panels a to d, and a patient with spontaneous, bilateral upper extremity neuropathy (i.e. Parsonage-Turner syndrome leading to severe muscle weakness) in panels e to h. As to the healthy subject, panels a and b respectively show coronal MRI $T_2$-weighted images from the left and the right brachial plexi, while dashed line in panels a and b shows the respective muscle fiber diameter maps of the oblique axial diffusion acquisition for panels c and d. The coronal Dixon water images from panels a and b confirm no muscle edema patterns in the healthy subject. Regarding the patient with spontaneous neuropathy, panels e to f show the coronal MRI $T_2$-weighted images from the left and the right brachial plexus while panels g to h show the respective muscle fiber diameter maps of the oblique axial diffusion acquisition. A comparison between the two subjects demonstrate that the patient has reduced diameter relative to the healthy subject. In particular, results from the healthy subject demonstrates high AFD in the left (c) and right (d) shoulder muscles. As to the patient, clinical exam reported deltoid weakness on the left (g) and right (h), and infraspinatus and supraspinatus (not shown) weakness only on the right. The result of right deltoid and infraspinatus muscles (2/5 British Medical Research Council muscle grade testing) being weaker than the left (3/5) was consistent with AFD on the right (h) being lower than the left (g). Arrows point to denervated muscle identified on MRI, green arrows to non-denervated muscle.

In an additional study, 30 subjects underwent both electromyography (EMG) and 3-Tesla MRI for suspected neuropathy. In this study, diffusion imaging was also performed to obtain the apparent fiber diameter (AFD). For EMG, motor unit recruitment (MUR) and denervation potentials were assessed. Linear mixed models were used to estimate AFD differences between EMG grades. Significant AFD decreases (by −11.04 to −21.58 μm, p=0.0136) were observed with all abnormal motor unit recruitment (MUR) grades as compared to 'full' MUR (mean of 78.35 μm). Significant changes in AFD were also observed with increased denervation potentials (by −16.25 to −18.66 μm, p<0.0001). This additional study further confirms the robustness of the implementations described in this disclosure.

As used herein, the terms "comprises" and "comprising" are to be construed as being inclusive and open-ended, and not exclusive. Specifically, when used in the specification and claims, the terms "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. In one non-limiting example, the terms "about" and "approximately" mean plus or minus 10 percent or less.

At least portions of the implementations of the subject matter and the functional operations described in this specification can be implemented in digital electronic circuitry, in tangibly-implemented computer software or firmware, in computer hardware, including the structures disclosed in this specification and their structural equivalents, or in combinations of one or more of them. Implementations of the subject matter described in this specification can be implemented as one or more computer programs, i.e., one or more modules of computer program instructions encoded on a tangible non-transitory program carrier for execution by, or to control the operation of, data processing apparatus. The computer storage medium can be a machine-readable storage device, a machine-readable storage substrate, a random or serial access memory device, or a combination of one or more of them.

The term "data processing apparatus" refers to data processing hardware and encompasses all kinds of apparati, devices, and machines for processing data, including, by way of example, a programmable processor, a computer, or multiple processors or computers. The apparatus can also be or further include special purpose logic circuitry, e.g., a central processing unit (CPU), a FPGA (field programmable gate array), or an ASIC (application specific integrated circuit). In some implementations, the data processing apparatus and/or special purpose logic circuitry may be hardware-based and/or software-based. The apparatus can optionally include code that creates an execution environment for computer programs, e.g., code that constitutes processor firmware, a protocol stack, a database management system, an operating system, or a combination of one or more of them. The present disclosure contemplates the use of data processing apparatuses with or without conventional operating systems, for example Linux, UNIX, Windows, Mac OS, Android, iOS or any other suitable conventional operating system.

A computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a communication network. While portions of the programs illustrated in the various figures are shown as individual modules that implement the various features and functionality through various objects, methods, or other processes, the programs may instead include a number of sub-modules, third party services, components, libraries, and such, as appropriate. Conversely, the features and functionality of various components can be combined into single components as appropriate.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., a central processing unit (CPU), a FPGA (field programmable gate array), or an ASIC (application specific integrated circuit).

Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media (transitory or non-transitory, as appropriate) suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The memory may store various objects or data, including caches, classes, frameworks, applications, backup data, jobs, web pages, web page templates, database tables, repositories storing business and/or dynamic information, and any other appropriate information including any parameters, variables, algorithms, instructions, rules, constraints, or references thereto. Additionally, the memory may include any other appropriate data, such as logs, policies, security or access data, reporting files, as well as others. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube), LCD (liquid crystal display), or plasma monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

The term "graphical user interface," or GUI, may be used in the singular or the plural to describe one or more graphical user interfaces and each of the displays of a particular graphical user interface. Therefore, a GUI may represent any graphical user interface, including but not limited to, a web browser, a touch screen, or a command line interface (CLI) that processes information and efficiently presents the information results to the user. In general, a GUI may include a plurality of user interface (UI) elements, some or all associated with a web browser, such as interactive fields, pull-down lists, and buttons operable by the business suite user. These and other UI elements may be related to or represent the functions of the web browser.

Implementations of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network (LAN), a wide area network (WAN), e.g., the Internet, and a wireless local area network (WLAN).

The computing system can include clients and servers. A client and server are generally remote from each other and typically interact through a communication network. The relationship of client and server arises by virtue of computer programs running on the respective computers and having a client-server relationship to each other.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A computer-implemented method comprising:
generating a set of simulated diffusion signals based on a set of diffusion sampling parameters and a set of microstructural model parameters, wherein the diffusion sample parameters correspond to magnetic resonance (MR) parameters for acquiring MR signals using diffusion sensitizing gradients having a spatial orientation;

processing the set of simulated diffusion signals based on the set of diffusion sampling parameters to generate a set of output metrics, wherein the set of output metrics are associated with the spatial orientation;

averaging multiple sets of output metrics into a dictionary, wherein each set of the multiple sets of output metrics are generated by processing a corresponding set of simulated diffusion signals generated based on a corresponding set of diffusion sampling parameters and the set of microstructural model parameters, wherein each set of the multiple sets of output metrics are associated with a respective spatial orientation;

applying the dictionary to a set of acquired diffusion MR signals; and subsequently generating at least one macroscopic diffusion feature that is orientation invariant and derived from the set of microstructural model parameters.

2. A computer system comprising at least one computer processor configured to perform operations of:

generating a set of simulated diffusion signals based on a set of diffusion sampling parameters and a set of microstructural model parameters, wherein the diffusion sample parameters correspond to magnetic resonance (MR) parameters for acquiring MR signals using diffusion sensitizing gradients having a spatial orientation;

processing the set of simulated diffusion signals based on the set of diffusion sampling parameters to generate a set of output metrics, wherein the set of output metrics are associated with the spatial orientation;

averaging multiple sets of output metrics into a dictionary, wherein each set of the multiple sets of output metrics are generated by processing a corresponding set of simulated diffusion signals generated based on a corresponding set of diffusion sampling parameters and the set of microstructural model parameters, wherein each set of the multiple sets of output metrics are associated with a respective spatial orientation;

applying the dictionary to a set of acquired diffusion MR signals; and subsequently generating at least one macroscopic diffusion feature that is orientation invariant and derived from the set of microstructural model parameters.

3. The computer-implemented method of claim 1, wherein said applying comprises:

processing the set of acquired diffusion MR signals to generate a set of acquired metrics; and based on the set of acquired metrics, performing a lookup at the dictionary to generate the at least one macroscopic diffusion feature.

4. The computer-implemented method of claim 1, wherein the at least one macroscopic diffusion feature comprises: an apparent fiber diameter, and an apparent fluid fraction.

5. The computer-implemented method of claim 1, wherein the output metrics comprise: a mean diffusivity MD, an axial diffusivity AD, a radial diffusivity RD, a fractional anisotropy FA, and a compartment fraction $f_{Res}$ for restricted motion, a compartment fraction $f_{Hin}$ for hindered motion, and a compartment fraction $f_{Fre}$ for free motion.

6. The computer-implemented method of claim 1, wherein the diffusion sampling parameters comprise: a b-value b, a normalized gradient vector g, a mixing time $\Delta$, and a pulse width $\delta$.

7. The computer-implemented method of claim 1, wherein the microstructural model parameters comprise: a radius r, an intracellular diffusivity $D_0$, a fluid fraction $\rho$, a parallel diffusivity $D_1$, and a fluid diffusivity $D_\rho$.

8. The computer-implemented method of claim 1, wherein said processing comprises performing one or more diffusion fittings of the set of simulated diffusion signals.

9. The computer-implemented method of claim 1, wherein said averaging comprises one of: an arithmetic mean, a geometric mean, or a median.

10. The computer system of claim 2, wherein the operation of applying a set of acquired diffusion MR signals to the dictionary comprises:

processing the set of acquired diffusion MR signals to generate a set of acquired metrics; and based on the set of acquired metrics, performing a lookup at the dictionary to generate the at least one macroscopic diffusion feature.

11. The computer system of claim 2, wherein the at least one macroscopic diffusion feature comprises: an apparent fiber diameter, and an apparent fluid fraction.

12. The computer system of claim 2, wherein the output metrics comprise: a mean diffusivity MD, an axial diffusivity AD, a radial diffusivity RD, a fractional anisotropy FA, and a compartment fraction $f_{Res}$ for restricted motion, a compartment fraction $f_{Hin}$ for hindered motion, and a compartment fraction $f_{Fre}$ for free motion.

13. The computer system of claim 2, wherein the diffusion sampling parameters comprise: a b-value b, a normalized gradient vector g, a mixing time $\Delta$, and a pulse width $\delta$.

14. The computer system of claim 2, wherein the microstructural model parameters comprise: a radius r, an intracellular diffusivity $D_0$, a fluid fraction $\rho$, a parallel diffusivity $D_1$, and a fluid diffusivity $D_\rho$.

15. The computer system of claim 2, wherein the operation of processing the set of simulated diffusion signals comprises performing one or more diffusion fittings of the set of simulated diffusion signals.

16. The computer system of claim 2, wherein said averaging comprises one of: an arithmetic mean, a geometric mean, or a median.

17. The computer-implemented method of claim 2, wherein the set of acquired diffusion MR signals is obtained using a corresponding set of diffusion sample parameters for a corresponding spatial orientation.

18. The computer-implemented method of claim 8, wherein the one or more diffusion fittings comprise: a model-based de-noising, or a diffusion tensor imaging (DTI) fitting.

19. The computer system of claim 10, wherein the set of acquired diffusion MR signals is obtained using a corresponding set of diffusion sample parameters for a corresponding spatial orientation.

20. The computer system of claim 15, wherein the one or more diffusion fittings comprise: a model-based de-noising, or a diffusion tensor imaging (DTI) fitting.

* * * * *